United States Patent [19]
Michael

[11] Patent Number: 5,869,378
[45] Date of Patent: Feb. 9, 1999

[54] METHOD OF REDUCING OVERLAP BETWEEN GATE ELECTRODE AND LDD REGION

[75] Inventor: Mark W. Michael, Cedar Park, Tex.

[73] Assignee: Advanced Micro Devices, Inc., Sunnyvale, Calif.

[21] Appl. No.: 637,980

[22] Filed: Apr. 26, 1996

[51] Int. Cl.[6] .................................................. H01L 21/336
[52] U.S. Cl. .......................... 438/305; 438/287; 438/306; 438/307
[58] Field of Search ............................. 438/30, 152, 154, 438/286, 287, 299, 301, 303, 305, 306, 307, 585, 595, 168, 185, 188, DIG. 174, DIG. 177, DIG. 185, DIG. 188

[56] References Cited

U.S. PATENT DOCUMENTS

| | | | |
|---|---|---|---|
| 4,402,761 | 9/1983 | Feist | 438/286 |
| 4,486,943 | 12/1984 | Ryden et al. | 29/571 |
| 4,722,909 | 2/1988 | Parrillo et al. | 438/305 |
| 5,340,774 | 8/1994 | Yen | 438/303 |
| 5,462,884 | 10/1995 | Taniguchi | 438/286 |

FOREIGN PATENT DOCUMENTS

| | | |
|---|---|---|
| 363029587 | 2/1988 | Japan . |
| 63-29587 | 2/1988 | Japan . |
| 363200569 | 8/1988 | Japan . |
| 401145863 | 6/1989 | Japan . |

*Primary Examiner*—Peter Toby Brown
*Assistant Examiner*—Khanh Duong
*Attorney, Agent, or Firm*—Skjerven, Morrill, MacPherson, Franklin & Friel LLP

[57] ABSTRACT

A method of manufacturing an integrated circuit so as to reduce overlap between an LDD region and a gate electrode is disclosed. The method includes forming a gate electrode on a gate insulator on a semiconductor substrate, implanting a lightly-doped drain (LDD) region in the substrate using the gate electrode as a mask, removing a lateral portion of the gate electrode after implanting the LDD region, and then laterally diffusing the LDD region into the substrate such that a lateral edge of the LDD region is substantially aligned with a lateral edge of the gate electrode. Preferably, the lateral portion of the gate electrode is removed using an isotropic etch. The method further includes forming a spacer adjacent to an edge of the gate electrode after removing the lateral portion, and then implanting a heavily-doped region using the spacer and gate electrode as an implant mask.

25 Claims, 4 Drawing Sheets

METHOD OF REDUCING OVERLAP BETWEEN GATE ELECTRODE AND LDD REGION

BACKGROUND OF THE INVENTION

1. Field of the Invention

The present invention relates to integrated circuit manufacturing, and more particularly to a method of producing a MOSFET with reduced overlap between the gate electrode and an LDD region.

2. Description of Related Art

The metal-oxide semiconductor field-effect transistor (MOSFET) uses a gate electrode to control an underlying surface channel joining a source and a drain. The channel, source and drain are located in a semiconductor substrate, with the substrate being doped oppositely to the source and drain. The gate electrode is separated from the semiconductor substrate by a thin insulating layer, referred to as the gate oxide. The operation of the MOSFET involves application of an input voltage to the gate electrode, which sets up a transverse electric field in the channel in order to modulate the longitudinal conductance of the channel.

In typical MOS processing, the source and drain are formed by introducing dopants into the semiconductor substrate. Introducing dopants by ion implantation tends to damage the semiconductor substrate. Most of the damage created by ion implantation can be annealed out at a high temperature (usually above 800° C.), which drives the source and drain farther into the semiconductor substrate. Aluminum has been used as the gate electrode. However, since aluminum must be deposited following completion of all high-temperature process steps (including drive-in of the source and drain regions), the gate electrode must be separately aligned to the source and drain. The alignment procedure adversely affects both packaging density and parasitic overlap capacitances between the gate electrode and the source/drain regions.

Polysilicon (also called polycrystalline silicon, poly-Si or poly) thin films have many important uses in MOS technology. One of the key innovations is the use of heavily-doped polysilicon as the gate electrode in place of aluminum. Since polysilicon has the same high melting point as a silicon substrate, it can be deposited prior to source and drain formation. Furthermore, the gate electrode itself can serve as a mask during formation of the source and drain regions (by either diffusion or ion implantation). The gate becomes nearly perfectly aligned over the channel, with the overlap of the source and drain being due in-part to lateral diffusion of the dopant atoms.

As MOSFET dimensions are reduced and the supply voltage remains constant (e.g., 5 V), the electric field in the gate oxide tends to increase. If the electric field becomes strong enough, it can give rise to so-called hot-carrier effects. That is, the high electric field causes electrons in the channel to gain kinetic energy and become "hot". Such hot electrons can lose energy via impact ionization which generates electron-hole pairs that can lead to a form of avalanche breakdown. Hot electrons can also overcome the potential energy barrier between the silicon substrate and the gate oxide thereby causing hot carriers to become injected into the gate oxide. The trapped charge accumulates over time and can lead to permanent changes in the threshold voltage of the device. Changes to the threshold voltage can change other MOSFET characteristics, such as saturation current and transconductance.

MOSFET performance degradation from hot electron effects can be reduced by a number of techniques. One such technique is a lightly-doped drain (LDD). The purpose of LDDs is to absorb some of the potential into the drain and thus reduce the maximum electric field. The source and drain are formed by two implants. One of these is self-aligned to the gate electrode, and the other is self-aligned to the gate electrode on which two sidewall spacers have been formed. The sidewall spacers are typically oxides. The purpose of the lighter first dose is to form a lightly-doped section of the drain at the edge near the channel. The maximum electric field value is reduced since the voltage drop is shared by the drain and the channel (as opposed to almost the entire voltage drop across the lightly-doped channel region). Reducing the electric field on the order of 30–40% can reduce hot-electron-induced currents by several orders of magnitude. The second heavier dose forms a low resistivity region of the drain region, which is merged with the lightly-doped region. Since the heavily-doped region is farther away from the channel than a conventional drain structure, the depth of the heavily-doped region can be made somewhat greater without adversely affecting the device characteristics. The lightly doped region is not necessary for the source (unless bidirectional current is used), however LDD structures are typically formed for both the source and drain to avoid the need for an additional masking step. The use of LDDs has other advantages, including reducing short-channel effects such as threshold voltage rolloff.

A drawback with conventional LDD fabrication using ion implantation is that after the lightly-doped region is formed, driving-in the source and drain regions by high-temperature processing causes the lightly-doped regions to laterally diffuse beneath the gate, thereby increasing the overlap between the gate electrode and the LDD. During device operation, this overlap tends to increase capacitance which reduces switching speeds. One approach for minimizing the overlap is to exercise stringent process controls in order to reduce excessive LDD diffusions. A problem with this approach is that a certain amount of LDD diffusion and corresponding overlap is inevitable. Needless to say, a better method is needed for reducing overlap between LDD regions and the gate electrode.

SUMMARY OF THE INVENTION

The present invention provides a method of reducing overlap between an LDD region and a gate electrode. The essential aspect of the invention is removing a lateral portion of the gate electrode after implanting the LDD region. Preferably, the size of the removed lateral portion is selected so that after the LDD region is laterally diffused, an edge of the LDD region will be substantially aligned with an edge of the gate electrode. In this manner, an overlap between the LDD region and the gate electrode can be substantially reduced or eliminated.

In accordance with an embodiment of the invention, a method of manufacturing an integrated circuit so as to reduce overlap between an LDD region and a gate electrode includes forming a gate electrode on a gate insulator on a semiconductor substrate, implanting a lightly-doped drain (LDD) region in the substrate using the gate electrode as a mask, laterally diffusing the LDD region into the substrate, removing top and opposing lateral portions of the gate electrode after implanting the LDD region, and forming a spacer adjacent to an edge of the gate electrode after removing the top and opposing lateral portions. Thereafter, the gate electrode and spacer can be used as an implant mask for implanting a heavily-doped region into a portion of the LDD region to finish forming the drain.

In accordance with another embodiment of the invention, the gate electrode is polysilicon, the gate insulator and the spacer are oxides, and the lateral portion of the polysilicon gate is removed by applying an isotropic dry etch which etches all exposed surfaces of the polysilicon gate at substantially the same rate.

BRIEF DESCRIPTION OF THE DRAWINGS

In the drawings, in which like reference characters indicate like parts.

DETAILED DESCRIPTION OF THE PREFERRED EMBODIMENT

FIGS. 1–12 show cross-sectional views of successive process steps for manufacturing an N-channel MOSFET in an integrated circuit, in accordance with an embodiment of the invention. It is understood that the drawings are not to scale.

Figure 1:
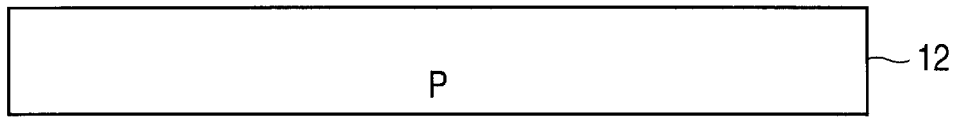
FIGS. 1–12 show cross-sectional views of successive process steps for manufacturing an N-channel MOSFET in accordance with an embodiment of the invention.

In FIG. 1, a semiconductor substrate suitable for integrated circuit manufacture is provided. Substrate 12 has a <100> orientation and a concentration of P-type dopants on the order of $10^{16}$ ions/cm$^3$.

Figure 2:
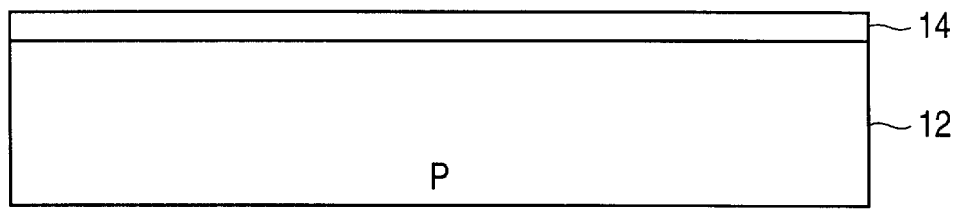

In FIG. 2, a blanket layer of gate oxide 14 is thermally grown on the top surface of substrate 12. Gate oxide 14 has a thickness in the range of 60 to 120 angstroms.

Figure 3:
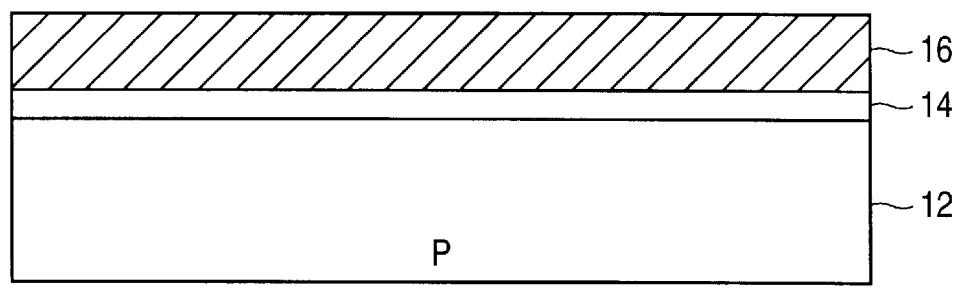

In FIG. 3, a blanket layer of polysilicon 16 is deposited by low pressure chemical vapor deposition (LPCVD) on the top surface of gate oxide 14. Polysilicon 16 has a thickness in the range of 2,000 to 3,000 angstroms. Although polysilicon 16 can now be doped with phosphorus, it is preferable to defer doping the polysilicon 16 until a later process step.

Figure 4:
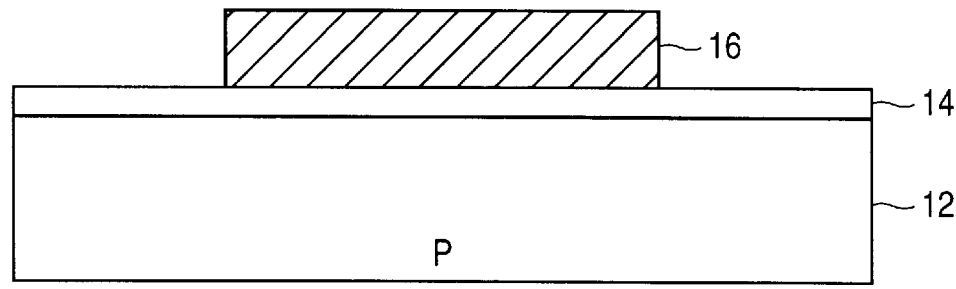

In FIG. 4, polysilicon 16 is patterned using photolithography and an anisotropic dry etch. For submicron dimensions, I-line photolithography using a mercury vapor lamp is preferred. In the regions where polysilicon 16 is removed, an upper portion of gate oxide 14 is removed, but a lower portion of gate oxide 14 remains on substrate 12 and prevents the dry etch from reaching substrate 12. The patterned polysilicon has a width in the range of 2,000 to 10,000 angstroms.

Figure 5:
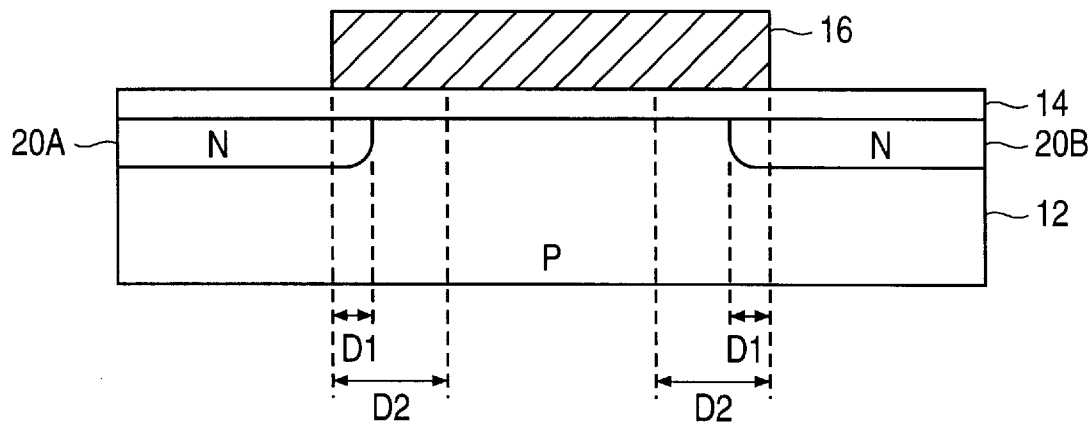

In FIG. 5, LDD regions 20A and 20B are implanted into substrate 12 using polysilicon 16 as an implant mask. Therefore, only active regions covered by gate oxide 14 (and no polysilicon 16) are implanted. An ion beam directed at substrate 12 contains phosphorus ions with a concentration of $10^{13}$ atoms/cm$^2$ and an energy in the range of 20 to 80 Kiloelectron-Volts. As a result, LDD regions 20A and 20B are doped N-type with a dopant concentration on the order of $10^{17}$ atoms/cm$^3$ and a junction depth in the range of 100 to 300 angstroms. LDD regions 20A and 20B are self-aligned to the polysilicon gate, and the width of polysilicon 16 plays a major role in defining the channel length. Polysilicon 16 and LDD regions 20A and 20B will be used to fabricate a gate, source, and drain, respectively, of a MOSFET.

A phenomena called channeling may occur when the ion beam which implants the dopants is closely aligned with the crystal lattice of the silicon. When channeling occurs, the dopants are initially implanted deep beneath the top surface of the substrate, but then as implantation continues the substrate surface becomes amorphous and less channeling occurs. Unfortunately, the depth of the channeled dopants is difficult to control. Therefore, it is desirable to minimize channeling. Channeling can be avoided by tilting the substrate (typically, at an angle of 7°) with respect to the ion beam. However, implanting off-axis can cause asymmetric doping of the source and drain regions, that is, lateral shadowing of the substrate on one side of the polysilicon, and penetration of dopants through the leading corner of the polysilicon on the other side. Furthermore, the implanted region in the shadow of the gate might have its edge displaced from the gate edge, and even after a drive-in step the overlap of the shadowed edge will be less than the overlap of the nonshadowed edge.

Preferably, substrate 12 receives little or no tilt during ion implantation in order to avoid LDD edge displacement due to shadowing. Oxide 14 outside polysilicon 16 serves to absorb some of the energy in the ions before they reach substrate 12 in order to reduce channeling. In conventional processes, it may be desirable to form another oxide layer (not shown) over oxide 14 in order to further reduce channeling. However, in the present invention, as will be apparent, it is desirable to leave polysilicon 16 exposed after the LDD implant occurs.

Random scattering of the implanted dopants will result in a small portion of LDD regions 20A and 20B, measured as the lateral straggle, being disposed beneath polysilicon 16. The lateral straggle is depicted as overlap distance D1, representing the lateral distance between the left edge of polysilicon 16 and the right edge of LDD region 20A, and the lateral distance between the right edge of polysilicon 16 and the left edge of LDD region 20B. The lateral straggle is approximately 60% of the junction depth. Since regions 20A and 20B have a junction depth in the range of 100 to 300 angstroms, the lateral straggle (or distance D1) is approximately 60 to 180 angstroms.

In conventional processes, spacers might be fabricated in the next step. A drawback to this approach, however, is that overlap distance D1 remains intact. Furthermore, high-temperature steps normally follow the LDD implant step. For instance, an anneal (or drive-in) step is eventually performed to activate the implanted LDD dopants. In addition, high-temperature steps may be used to grow additional oxide layers or react various materials. The high-temperature steps tend to diffuse LDD regions 20A and 20B farther into substrate 12. The diffusion is both lateral and vertical. Although the subsequent high-temperature steps should laterally redistribute LDD regions 20A and 20B by only a few hundred of angstroms, it is critical to note that the overlap distance D1 will increase to a greater overlap distance D2. Overlap distance D2 represents the lateral distance between the left edge of polysilicon 16 and the right edge of LDD region 20A after LDD region 20A is diffused, and between the right edge of polysilicon 16 and a left edge of diffused LDD region 20B after LDD region 20B is diffused. Unfortunately, the overlap problems presented by overlap distance D1 are compounded by overlap distance D2.

Figure 6:
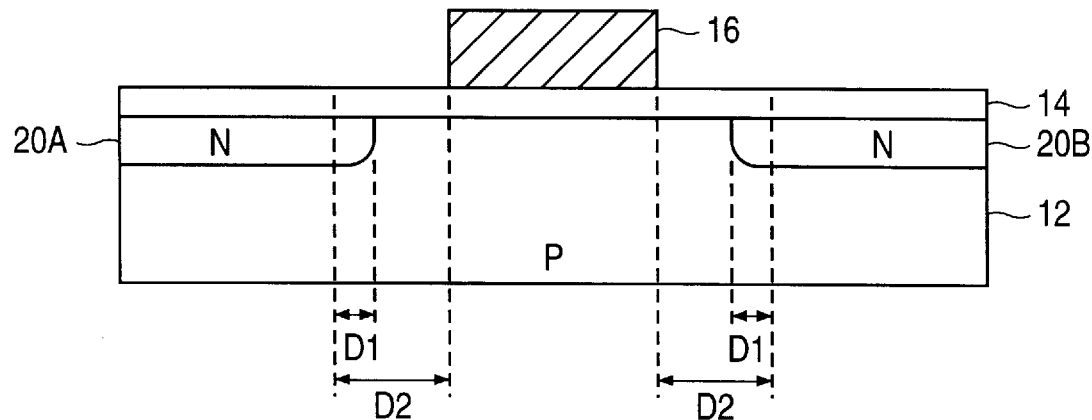

In FIG. 6, the polysilicon is exposed to an isotropic etch. The isotropic etch has little or no directional preference, and therefore etches all exposed polysilicon surfaces at substantially the same rate. This results in removing a substantially equal amount, for instance 300 angstroms, of polysilicon from all exposed surfaces of polysilicon 16. Most importantly, the isotropic etch removes a top portion and removes opposing lateral portions of polysilicon 16 by the overlap distance D2. An isotropic dry etch is preferred over an isotropic wet etch since the dry etch is easier to control. For example, a fluorine-based plasma can be applied in order to etch the polysilicon isotropically. See, for instance, SILICON PROCESSING FOR THE VLSI ERA, Volume 1:

Process Technology, by S. Wolf and R. N. Tauber, published by Lattice Press, Sunset Beach, Calif, p. 557 (1986), which is incorporated by reference. It is critical to note that the isotropic etching serves to laterally narrow the opposing edges of polysilicon 16 each by distance D2. Stated differently, the edges of polysilicon 16 are now laterally aligned with where the edges of LDD regions 20A and 20B will be after these regions are farther diffused into substrate 12. After isotropic etching occurs, it is preferred that polysilicon 16 have a thickness of at least 1,000 angstroms, although this is not essential.

Figure 7:
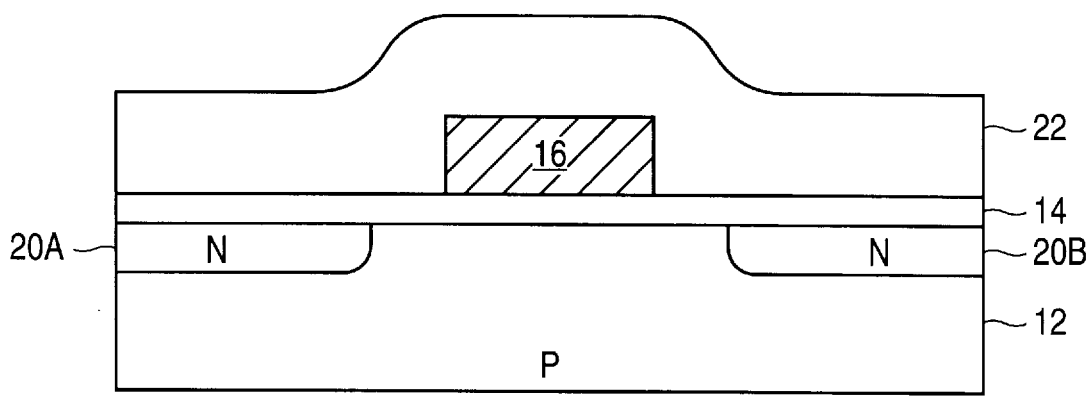

In FIG. 7, a layer of oxide 22 is conformally deposited over the exposed surfaces. Oxide 22 is deposited by CVD at a temperature in the range of 300° to 400° C. and has a thickness in the range of 6,000 to 20,000 angstroms.

Figure 8:
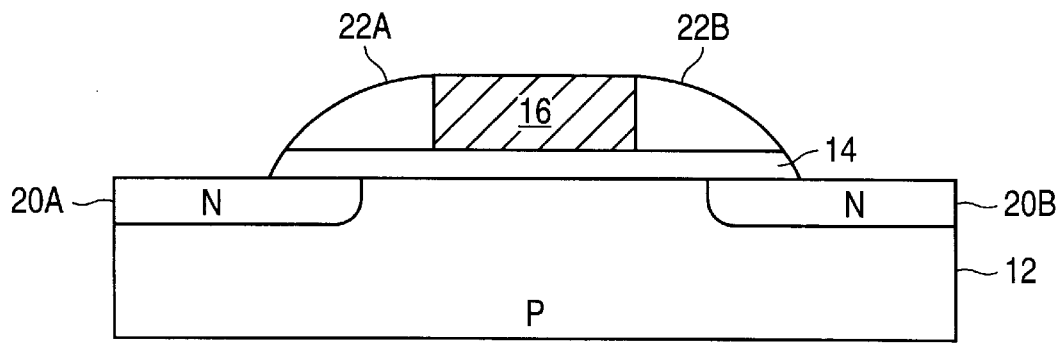

In FIG. 8, oxide 22 is subjected to a reactive ion etch (RIE) in order to form sidewall spacers 22A and 22B adjacent to opposing sidewalls of polysilicon 16 and above inner portions of LDD regions 20A and 20B, respectively. The RIE clears oxide 22 from the top of polysilicon 16, and also clears oxides 14 and 22 outside polysilicon 16 and spacers 22A and 22B. In accordance with the invention, spacers 22A and 22B contact sidewalls of polysilicon 16 that are formed after the LDD regions are implanted. The purpose of spacers 22A and 22B is to protect inner portions of the LDD regions 20A and 20B, respectively, during later implant steps. To ensure a high quality interface under the sidewall spacers, it is important to that oxide 14 remains in place after the polysilicon is anisotropically and later isotropically etched.

Figure 9:
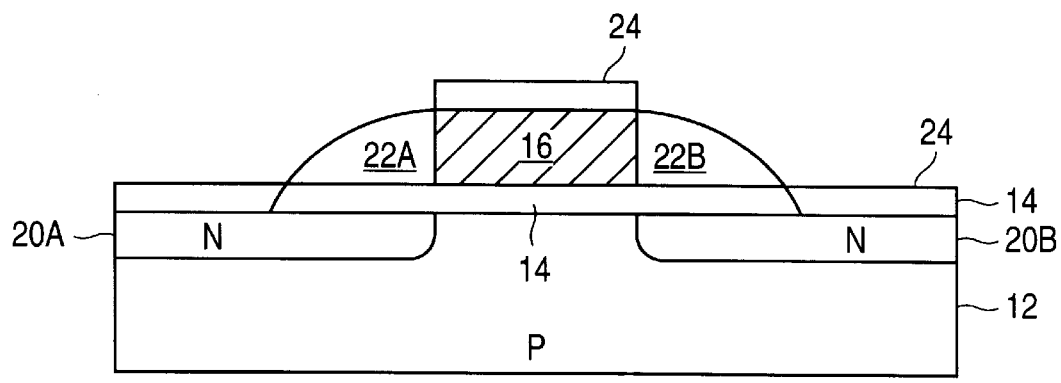

In FIG. 9, oxide 24 is thermally grown during an oxidation step that also serves to densify the spacer oxide. The oxidation is performed at a temperature in the range of 850° to 950° C. for a time in the range of 40 to 60 minutes. Oxide 24 has a thickness in the range of 60 to 150 angstroms. Furthermore, the relatively long high-temperature tends to drive-in LDD regions 20A and 20B, and laterally diffuse regions 20A and 20B by a few hundred angstroms. Oxide 24 is formed mainly on substrate 12 and polysilicon 16. Only a negligible amount of oxide 24 grows on spacers 22A and 22B due to limited silicon availability at their exposed surfaces. For convenience of explanation, oxide 24 is not shown on spacers 22A and 22B. Since most of the diffusion of LDD regions 20A and 20B occurs during this oxidation step, for convenience of explanation, the edges of LDD regions 20A and 20B are shown as aligned with the edges of polysilicon 16.

Figure 10:
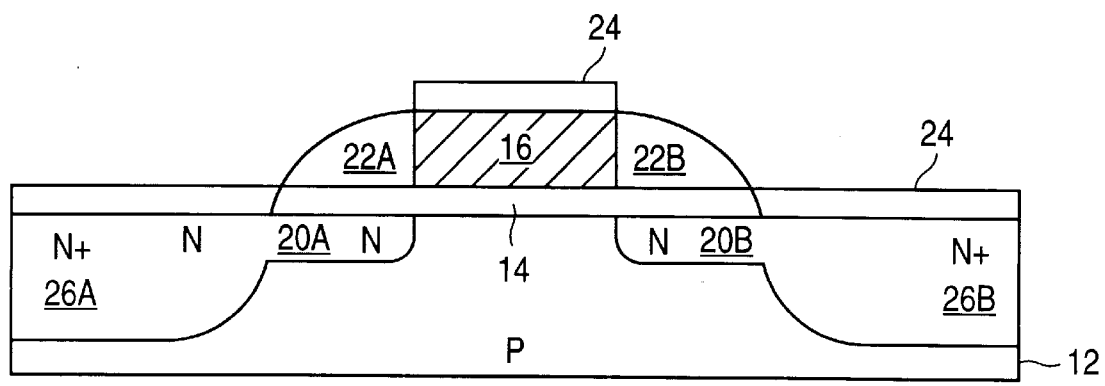

In FIG. 10, heavily-doped regions 26A and 26B are implanted into substrate 12 using polysilicon 16 and spacers 22A and 22B as an implant mask. In substrate 12, only active regions covered by oxide 24 outside polysilicon 16 and the spacers are implanted. Furthermore, polysilicon 16 is doped at the same time regions 26A and 26B are doped. An ion beam containing arsenic ions with a concentration of $10^{13}$ atoms/cm$^2$ and an energy in the range of 20–80 Kiloelectron-Volts is applied. As a result, polysilicon 16 and heavily-doped regions 26A and 26B are doped N-type (N+) on the order of $10^{19}$ atoms/cm$^3$. Regions 26A and 26B have a junction depth in the range of 1,500 to 2,500 angstroms.

Preferably, substrate 12 receives little or no tilt during ion implantation of the heavily-doped regions in order to avoid shadowing. Oxide 24 serves to reduce channeling. Although random scattering of the implanted dopants will result in a lateral straggle of regions 26A and 26B, spacers 22A and 22B have sufficient width to assure that there is wide lateral displacement (and thus no overlap) between regions 26A and 26B, and polysilicon 16.

Following the heavy source/drain implant, an anneal (or drive-in) step is performed to activate the implanted dopants in regions 26A and 26B. A rapid thermal anneal (RTA) on the order of 1000° C. for 10 seconds activates the implanted heavy dopants and also diffuses the implanted dopants in regions 20A, 20B, 26A and 26B farther into substrate 12. The diffusion is both lateral and vertical. However, due to the brief duration of the RTA, only a slight diffusion on the order of 10–50 angstroms occurs. In this manner, regions 26A and 26B merge with regions 20A and 20B, respectively. As a result, regions 20A and 26A collectively form the source, and regions 20B and 26B collectively form the drain. Furthermore, a wide lateral displacement remains between regions 26A, 26B and polysilicon 16. If desired, subsequent high-temperature process steps can be used to supplement or replace the drive-in steps to provide the desired anneal, activation, and drive-in functions.

Figure 11:
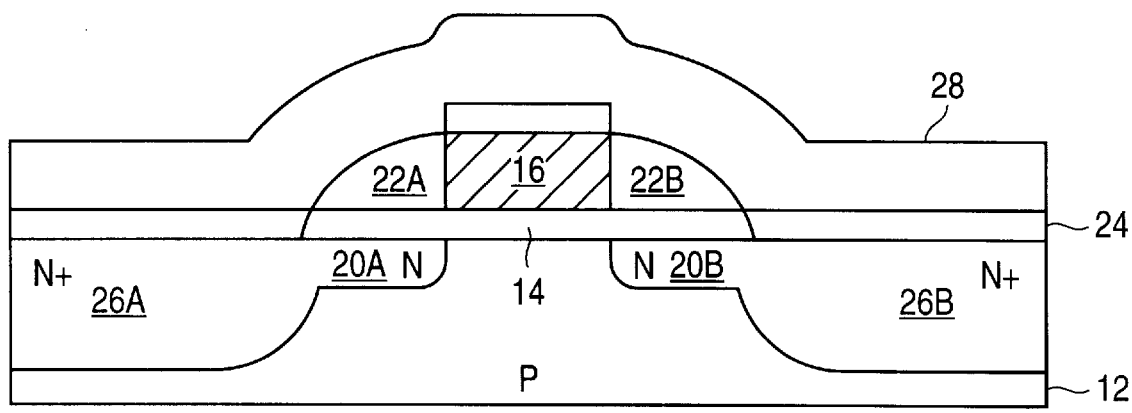

In FIG. 11, a layer of oxide 28 is deposited over the exposed top surfaces. Oxide 28 is deposited by CVD and has a thickness in the range of 6,000 to 20,000 angstroms.

Figure 12:
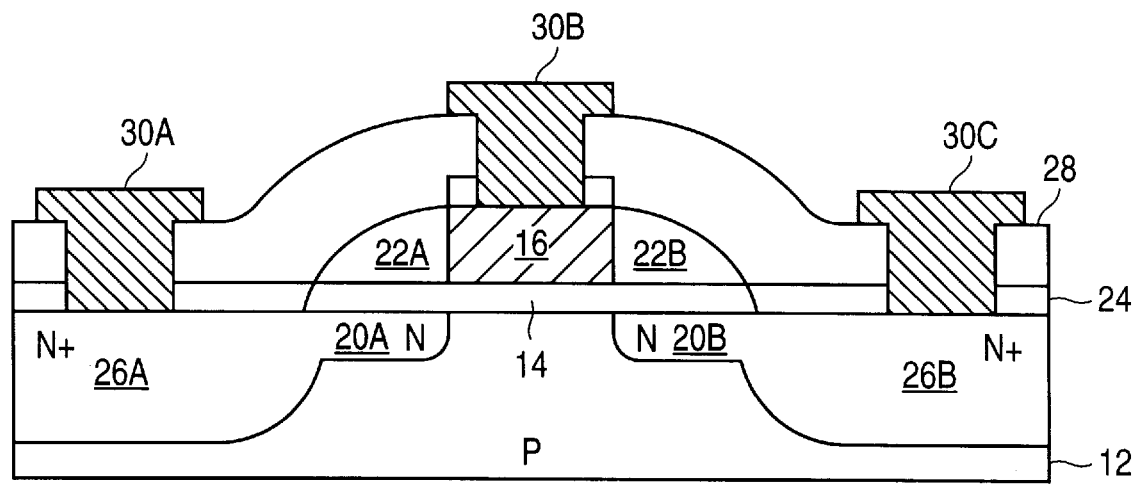

In FIG. 12, contact windows are formed in the oxides above polysilicon 16 and regions 26A and 26B, a layer of titaniun is deposited on the top surfaces, the titanium is reacted with the exposed polysilicon 16 and regions 26A and 26B to form low resistance titanium salicide contacts, and the unreacted titanium is stripped. Titanium salicide contacts 30A, 30B and 30C provide low-resistance electrical contacts for the source, gate, and drain, respectively, of the MOSFET.

At completion of the process, it is preferred that the lateral edges of polysilicon 16 be precisely aligned with the lateral edges of LDD regions 20A and 20B. LDD regions 20A and 20B laterally extend distance D2 inside the since-removed opposing edges of polysilicon 16 that existed during the LDD implant. LDD regions 20A and 20B are extended by distance D2 due to the combination of random scattering and diffusion. Since the isotropic etching narrows both opposing edges of polysilicon 16 by distance D2, the final lateral edges of polysilicon 16 and LDD regions 20A and 20B are precisely aligned. Moreover, to the extent that the edges of polysilicon 16 and LDD regions 20A and 20B are not (or can not be) precisely controlled, these edges are substantially aligned. With substantial alignment, it is far preferable to have a slight overlap between the polysilicon and the LDD regions instead of a displacement or gap. A slight overlap should be less than 100 angstroms. While a slight overlap will lead to slight capacitive effects, a lateral displacement between the polysilicon and the LDD regions could prevent formation of a conductive channel between the LDD regions during device operation.

Of course, the invention is well-suited for fabricating N-channel and P-channel MOSFETs, complementary metal-oxide semiconductor (CMOS) devices and other types of insulated-gate field-effect transistors (IGFETs), particularly for high-performance microprocessors where reduced parasitic overlap capacitance can significantly improve switching speeds. In addition, a majority of the LDD diffusion may occur before, or after, the lateral portions of the gate electrode are removed.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention.

Variations and modifications of the embodiments disclosed herein may be made based on the description set forth herein, without departing from the scope and spirit of the invention as set forth in the following claims.

What is claimed is:

1. A method of manufacturing an integrated circuit, comprising the steps of:
    forming a gate electrode on a gate insulator on a semiconductor substrate;
    implanting a lightly-doped drain (LDD) region in the substrate using the gate electrode as a mask; and
    removing top and opposing lateral portions of the gate electrode during an etch step after implanting the LDD region.

2. The method of claim 1, wherein removing the top and opposing lateral portions of the gate electrode reduces an overlap between the gate electrode and the LDD region.

3. The method of claim 1, wherein removing the top and opposing lateral portions of the gate electrode includes applying an isotropic etch to all of a top surface and opposing edges of the gate electrode.

4. The method of claim 1, further comprising forming a spacer adjacent to an edge of the gate electrode after removing the top and opposing lateral portions, and implanting a heavily-doped region in a portion of the LDD using the gate electrode and the spacer as a mask.

5. A method of manufacturing an integrated circuit so as to reduce overlap between an LDD region and a gate electrode, comprising the steps of:
    forming a gate electrode on a gate insulator on a semiconductor substrate;
    implanting a lightly-doped drain (LDD) region in the substrate using the gate electrode as a mask;
    laterally diffusing the LDD region into the substrate;
    removing top and opposing lateral portions of the gate electrode during an etch step after implanting the LDD region; and
    forming a spacer adjacent to an edge of the gate electrode after removing the top and opposing lateral portions.

6. The method of claim 5, wherein removing the top and opposing lateral portions of the gate electrode includes isotropically etching the gate electrode.

7. The method of claim 6, wherein isotropically etching the gate electrode includes etching all of a top surface and opposing lateral surfaces of the gate electrode at substantially a same rate.

8. The method of claim 6, wherein isotropically etching the gate electrode includes removing substantially a same thickness from all of a top surface and opposing lateral surfaces of the gate electrode.

9. The method of claim 5, wherein the gate electrode is polysilicon.

10. The method of claim 5, wherein after laterally diffusing the LDD region and removing the top and opposing lateral portions of the gate electrode, an edge of the LDD region is substantially aligned with an edge of the gate electrode.

11. The method of claim 10, wherein an overlap between the LDD region and the gate electrode, representing a distance that the edge of the LDD region laterally extends beneath the edge of the gate electrode, is less than approximately 100 angstroms.

12. The method of claim 5, further including implanting a heavily-doped region in a portion of the LDD region using the gate electrode and the spacer as an implant mask, thereby merging the heavily-doped and LDD regions to form a drain.

13. The method of claim 12, wherein forming the spacer includes depositing an oxide layer, and then applying a reactive ion etch.

14. The method of claim 12, wherein the heavily-doped region is laterally displaced from the gate electrode by a portion of the LDD region.

15. A method of manufacturing a MOSFET so as to reduce overlap between an LDD region and a polysilicon gate, comprising the steps of:
    providing a silicon substrate doped to a first conductivity type;
    forming a gate oxide layer on the substrate;
    depositing a polysilicon layer on the gate oxide layer;
    anisotropically etching the polysilicon layer to form a polysilicon gate using a dry etch;
    implanting a lightly-doped drain (LDD) region of a second conductivity type in the substrate using the polysilicon gate as a first implant mask that covers a first region of the substrate, wherein the implanting causes the LDD region to laterally extend within the first region by a first distance;
    laterally diffusing the LDD region into the substrate by applying heat, wherein the diffusing causes the LDD region to laterally extend within the first region beyond the first distance to a second distance, and the second distance is greater than the first distance;
    isotropically etching the polysilicon gate using a dry etch that is applied to all of a top surface and first and second opposing lateral edges of the polysilicon gate after implanting the LDD region, thereby removing a top portion and first and second opposing lateral portions of the polysilicon gate and advancing the first and second opposing lateral edges towards one another, wherein the first lateral portion extends within the first region by substantially the second distance;
    forming an oxide spacer adjacent to and in contact with the first lateral edge of the polysilicon gate after isotropically etching the polysilicon gate; and
    implanting a heavily-doped region of the second conductivity type in a portion of the LDD region using the polysilicon gate and the spacer as a second implant mask, wherein the heavily-doped region is laterally displaced from the polysilicon gate, and the heavily-doped and LDD regions form a drain.

16. The method of claim 15, wherein after laterally diffusing the LDD region and removing the first lateral portion of the polysilicon gate, a lateral edge of the LDD region is substantially aligned with the first lateral edge of the gate electrode.

17. The method of claim 16, wherein a majority of laterally diffusing the LDD region occurs before isotropically etching the polysilicon gate.

18. The method of claim 16, wherein a majority of laterally diffusing the LDD region occurs after isotropically etching the polysilicon gate.

19. The method of claim 16, wherein an overlap between the LDD region and the polysilicon gate, representing a distance that the lateral edge of the LDD region laterally extends beneath the first lateral edge of the gate electrode, is less than approximately 100 angstroms.

20. The method of claim 15, wherein the LDD region is implanted to a first depth, and the first distance is approximately 60% of the first depth.

21. The method of claim 15, wherein the first distance is in a range of approximately 60 to 180 angstroms.

22. The method of claim 15, wherein the second distance is approximately 300 angstroms.

23. The method of claim 15, wherein implanting the heavily-doped region of the second conductivity type also dopes the polysilicon gate to the second conductivity type.

24. The method of claim 15, wherein the first conductivity type is P-type and the second conductivity type is N-type.

25. The method of claim 15, wherein the first conductivity type is N-type and the second conductivity type is P-type.

* * * * *